(12) United States Patent
Behara et al.

(10) Patent No.: US 10,504,705 B2
(45) Date of Patent: Dec. 10, 2019

(54) PHYSICAL VAPOR DEPOSITION CHAMBER WITH STATIC MAGNET ASSEMBLY AND METHODS OF SPUTTERING

(71) Applicant: Applied Materials, Inc., Santa Clara, CA (US)

(72) Inventors: Sirisha Behara, Bangalore (IN); Sanjay Bhat, Bangalore (IN); Vibhu Jindal, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

(21) Appl. No.: 15/706,129

(22) Filed: Sep. 15, 2017

(65) Prior Publication Data
US 2019/0088456 A1    Mar. 21, 2019

(51) Int. Cl.
| H01J 37/34 | (2006.01) |
| C23C 14/35 | (2006.01) |
| C23C 14/18 | (2006.01) |
| C23C 14/34 | (2006.01) |
| G03F 1/24  | (2012.01) |

(52) U.S. Cl.
CPC ........ *H01J 37/3408* (2013.01); *C23C 14/185* (2013.01); *C23C 14/3407* (2013.01); *C23C 14/35* (2013.01); *C23C 14/352* (2013.01); *G03F 1/24* (2013.01); *H01J 37/345* (2013.01); *H01J 37/3452* (2013.01)

(58) Field of Classification Search
CPC .. H01J 37/3405; H01J 37/3408; H01J 37/345; H01J 37/3452; H01J 37/3455; H01J 37/3461; C23C 14/35

USPC ................ 204/298.19, 298.2; 430/5
See application file for complete search history.

(56) References Cited

U.S. PATENT DOCUMENTS

| 6,440,282 B1* | 8/2002 | Wada ............... H01J 37/3408 204/298.17 |
| 6,623,610 B1 | 9/2003 | Onishi |
| 9,620,339 B2 | 4/2017 | Subramani et al. |
| 9,708,706 B2 | 7/2017 | Kao et al. |
| 2003/0217914 A1* | 11/2003 | Miller ............... H01J 37/3408 204/192.12 |
| 2004/0140204 A1* | 7/2004 | Navala ............... C23C 14/35 204/298.2 |
| 2007/0108041 A1 | 5/2007 | Guo |
| 2008/0083610 A1 | 4/2008 | Tang et al. |
| 2014/0038088 A1* | 2/2014 | Lee ............... G03F 1/22 430/5 |
| 2014/0272684 A1* | 9/2014 | Hofmann ............... G03F 1/22 430/5 |

FOREIGN PATENT DOCUMENTS

KR    20100029958 A    3/2010

\* cited by examiner

*Primary Examiner* — Rodney G McDonald
(74) *Attorney, Agent, or Firm* — Servilla Whitney LLC

(57) ABSTRACT

Magnetrons for plasma sputter chambers, plasma sputter chambers including magnetrons and methods of processing a substrate such as an EUV mask blank in a plasma sputter chamber are disclosed. The magnetron comprises a plurality of elongate magnets arranged in a pattern where there is an unbalance ratio greater than 1 and less than 3.

20 Claims, 15 Drawing Sheets

PHYSICAL VAPOR DEPOSITION CHAMBER WITH STATIC MAGNET ASSEMBLY AND METHODS OF SPUTTERING

TECHNICAL FIELD

The present disclosure relates generally to substrate processing systems, and more specifically, to physical vapor deposition (PVD) processing systems.

BACKGROUND

Sputtering, alternatively called physical vapor deposition (PVD), has long been used in depositing metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively impact the properties of the final product.

Plasma sputtering may be accomplished using either DC sputtering or RF sputtering. Plasma sputtering typically includes a magnetron positioned at the back of the sputtering target including two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC Power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the wafer to be coated. Argon is admitted to the chamber. When a negative DC bias of several hundred volts is applied to target while the chamber walls or shields remain grounded, the argon is excited into a plasma. The positively charged argon ions are attracted to the negatively biased target at high energy and sputter target atoms from it.

Erosion of the target causes a problem in plasma sputtering. As the target is eroded, the sputtering surface within the target layer recedes and comes closer to the magnetron so that the magnetic field at the sputtering surface changes over the lifetime of the target. The sputtering rate depends on the magnitude of the magnetic field adjacent the sputtering surface, which increases with the depth of erosion. Also, the plasma may become unstable under changes of magnetic field, possibly extinguishing or sparking, the latter of which can create damaging particulates. Regardless of the target shape, the target erodes more preferentially at specific locations with respect to the magnetic fields of the magnets of the magnetron causing an uneven or asymmetric erosion profile. The uneven erosion profile of the target may result in poor uniformity of the deposited film and uneven film characteristics across the substrate. For example, poor step coverage may be achieved at some spatial locations of the substrate while good step coverage may be achieved at other areas of the substrate. There is need to provide apparatus and methods to reduce asymmetry of erosion profiles and provide erosion profiles that are more even.

SUMMARY

One or more embodiments of the disclosure are directed to a magnetron for a plasma sputter chamber comprising a magnetron comprising an outer pole, a first inner pole and a second inner pole positionable at a back of a sputtering target in a fixed relationship with the target; the outer pole comprising a plurality of first elongate magnets of a first magnetic polarity, the first elongate magnets mounted on a magnetic yoke arranged in a first closed pattern around a central region; the first inner pole disposed within the first closed pattern, separated from the outer pole by a gap, comprising a plurality of second elongate magnets of a second magnetic polarity opposite the first magnetic polarity arranged in a second closed pattern mounted on the magnetic yoke; and a second inner pole disposed in the central region and surrounded by the second closed pattern, separated from the first inner pole by a gap, comprising at least one of a third elongate magnet of the first magnetic polarity mounted on the magnetic yoke, the poles arranged such that there is an unbalance ratio defined by a total magnetic intensity of poles of magnets of the first polarity to the total magnetic intensity of poles of magnets of the second polarity and the unbalance ratio is greater than 1 and less than 3.

Additional embodiments pertain to a sputter chamber comprising the magnetrons described herein and a method of processing a substrate in a plasma sputter chamber including the magnetrons described herein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

Embodiments of the disclosure describe magnetrons for plasma sputter chambers, plasma sputter chambers including magnetrons and methods of processing a substrate such as an EUV mask blank in a plasma sputter chamber are disclosed. The magnetron comprises a plurality of elongate magnets arranged in a pattern where there is an unbalance ratio greater than 1 and less than 3.

Figure 1:
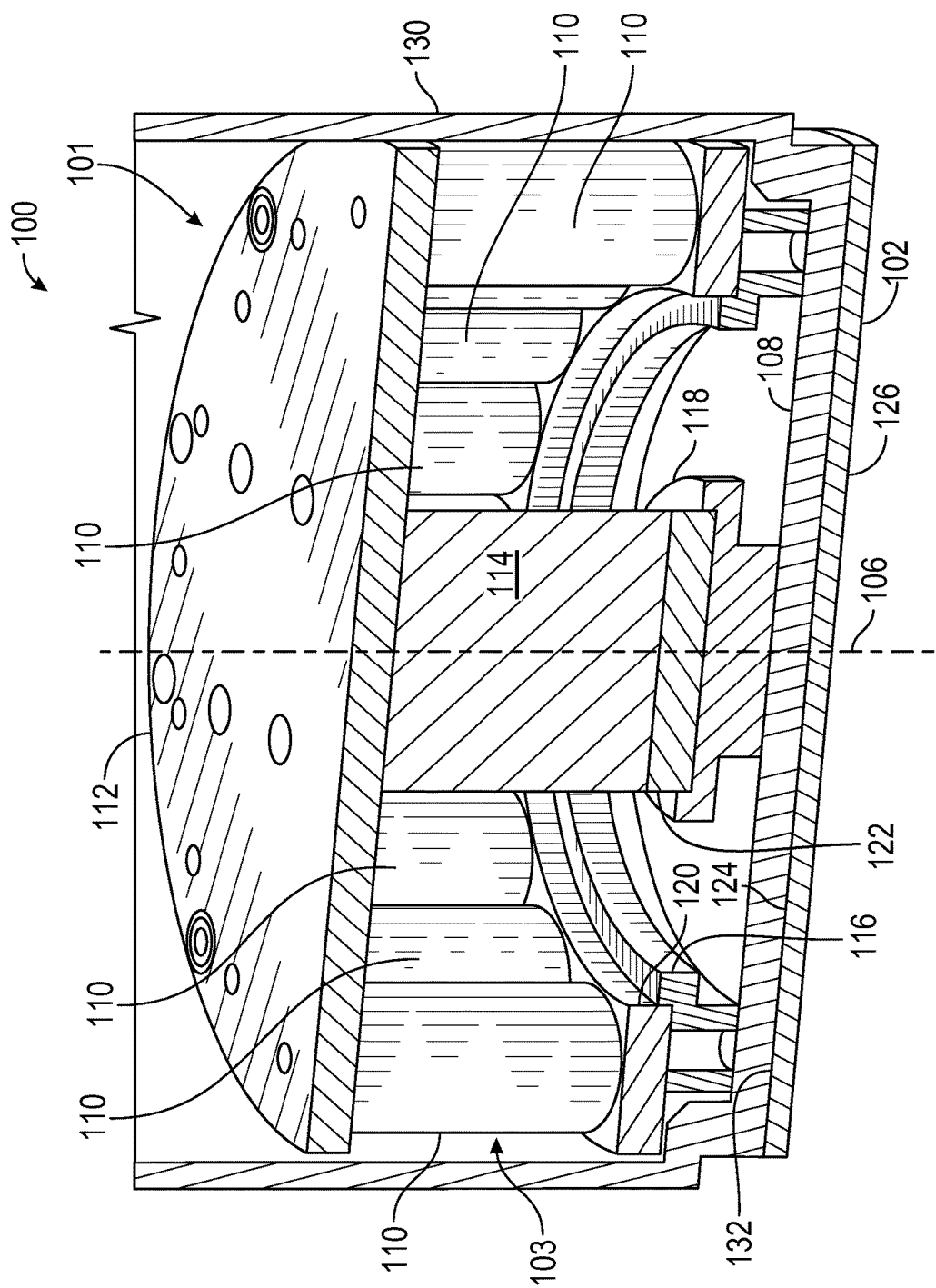
FIG. 1 illustrates a schematic cross-sectional view of a portion of a process chamber in accordance with some embodiments of the present disclosure.

FIG. 1 depicts a simplified, cross-sectional view of a portion of a physical vapor deposition (PVD) processing system, specifically, a plasma sputter chamber 100 in accordance with some embodiments of the present disclosure. Examples of chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

The plasma sputter chamber 100 in accordance with some embodiments of the present disclosure includes a sputter source 101, which includes a target 102 of source material and a magnetron 103 including an outer pole comprising a plurality of first elongate magnets 110 disposed proximate a back surface 124 of the target 102. The source material typically present in a target which acts as a cathode in the deposition operation.

The plurality of first elongate magnets 110 produces a magnetic field to, for example, maintain and/or shape a plasma formed in a process chamber to facilitate a desired sputtering of source material from the target 102 and subsequent deposition of the material atop a substrate disposed within the process chamber (e.g., the substrate 204 disposed in process chamber such as plasma sputter chamber 200 described below with respect to FIG. 2). The plurality of first elongate magnets 110 may be any type of magnet suitable to form the desired magnetic field, for example such as a permanent magnet or an electromagnet. In addition, the plurality of first elongate magnets 110 may be arranged in any manner suitable to form the desired magnetic field so that there is an unbalance ratio of greater than 1 and less than 3 according to one or more embodiments. Specific embodiments of magnet arrangement patterns are described further below. For example, in some embodiments, the plurality of first elongate magnets 110 may be annularly disposed symmetrically about a central axis 106 of the target 102. In such embodiments, the plurality of first elongate magnets 110 is disposed proximate the back surface 124 of the target 102 such that at least a portion of a magnetic field formed by the plurality of first elongate magnets 110 has an orientation that is substantially perpendicular to the back surface 124 of the target 102.

In some embodiments, the magnetron 103 may include additional magnets, for example such as at least an inner magnet 114 disposed proximate the central axis 106 of the target 102. When present, the inner magnet 114 may facilitate shaping the magnetic field formed by the plurality of first elongate magnets 110. The inner magnet 114 may be any type of magnet suitable to form the desired magnetic field, for example such as a permanent magnet or an electromagnet.

The target 102 comprises a front surface 126 having a source material to be deposited on a substrate and an opposing back surface 124. The target 102 may be fabricated from any suitable material suitable to be deposited on a substrate during a sputtering process. For example, in some embodiments, the target 102 may be fabricated from a nickel-iron alloy (NiFe), cobalt-iron alloy (CoFe), cobalt-iron-boron alloy (CoFeB), cobalt (Co), or the like.

In specific embodiments, the target comprises source material that is useful for forming an extreme ultraviolet (EUV) mask blank or EUV lens elements. Lens elements and mask blanks of extreme ultraviolet lithography systems are coated with reflective multilayer coatings of materials such as molybdenum and silicon. Multilayer coatings that strongly reflect light within an extremely narrow ultraviolet bandpass, for example, 12.5 to 14.5 nanometer bandpass for 13.5 nanometer ultraviolet light by Bragg interference. The PVD process chambers, such as the plasma sputter chamber 100, form thin layers on source substrates including the layers of silicon, metals, alloys, compounds, or a combination thereof. In specific embodiments, the chamber 100 can be used to form a multilayer stack including alternating reflective layers of a first reflective layer and a second reflective layer. In an embodiment, the first reflective layer and the second reflective layer are formed from silicon and molybdenum, respectively, but it is understood that the alternating layers can be formed from other materials or have other internal structures. In a non-limiting embodiment, the multilayer stack includes a range of 20-60 of the reflective pairs for a total of up to 120 reflective layers.

The sputter chamber can further include a target of source material that can be used to form a capping layer on the multilayer stack. In one or more embodiments the capping layer can be formed by sputtering a target of a source material having a hardness sufficient to resist erosion during cleaning, for example, ruthenium. The plasma sputter chamber can further be used to form an absorber layer over the multilayer stack, and where present, the capping layer. Thus the plasma sputter chamber may further comprise a target of source material to form an absorber layer that absorbs EUV radiation (e.g., 13.5 nm), for example, selected from the group consisting of platinum (Pt), zinc (Zn), gold (Au), nickel oxide (NiO), silver oxide ($Ag_2O$), iridium (Ir), iron (Fe), tin dioxide ($SnO_2$), cobalt (Co), chromium nickel alloys, $Ni_8Cr_2$, tin oxide (SnO), copper (Cu), silver (Ag), actinium (Ac), tellurium (Te), caesium iodide (CsI), tin (Sn), zinc telluride (ZnTe), antimony (Sb), tantalum (Ta), tantalum nitride (TaN), tantalum nitride oxide (TaNO), chromium (Cr), chromium nitride (CrN) and tantalum borate (TaBO). The sputter chamber can also include a target comprised of source material to form an antireflective coating on the absorber layer, for example, a source material comprising tantalum, such as tantalum oxide, tantalum oxynitride or tantalum boron oxide. As will be described further below, an aspect of the disclosure pertains to a processing chamber or system that can deposit the aforementioned materials to form an EUV mask blank, namely, the multilayer stack, the capping layer, the absorber layer and the antireflective layer. Thus, there may be a plurality of plasma sputter chamber in communication with each other by a load lock under vacuum a first chamber including a sputter source including a magnetron and target of a source material to form the multilayer stack (e.g., molybdenum and silicon), a second plasma sputter chamber containing a sputter source including a target of source material to form the capping layer, a third plasma sputter chamber including a sputter source including a target of source material to form the absorber layer, and a fourth plasma sputter chamber containing a sputter source including a target of source material to form an antireflective coating. In some embodiments, some or all of these layers can be formed in a multicathode PVD chamber or plasma sputter chamber comprising a plurality of sputter sources to form each of the respective layers for forming an EUV mask blank.

The physical vapor deposition system forms reflective layers, capping layers, and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof.

In some embodiments, a backing plate 108 may be disposed between the plurality of first elongate magnets 110 and the target 102 to support the target 102 and/or couple the target 102 to the sputter source 101. In some embodiments, the backing plate 108 may comprise a conductive material, such as copper-zinc, copper-chrome, or the same material as the target 102, such that RF and DC power can be coupled to the target 102 via the backing plate 108. Alternatively, the backing plate 108 may be non-conductive and may include conductive elements (not shown) such as electrical feedthroughs or the like. In some embodiments, the backing plate 108 may comprise one or more temperature control mechanisms to control a temperature of the sputter source 101 and/or target 102. For example, in some embodiments, the backing plate 108 may include one or more channels formed within the backing plate 108 to flow a temperature control fluid through the backing plate 108.

In some embodiments, the sputter source 101 may comprise an enclosure 130 surrounding the plurality of first elongate magnets 110. In such embodiments, the backing plate 108 may be coupled to the enclosure 130 to facilitate coupling the target 102 to the sputter source 101. Although described as two components, the backing plate 108 and enclosure 130 may be fabricated from a single piece of material, thereby providing a unitary design comprising both the backing plate 108 and enclosure 130.

In some embodiments, the plurality of first elongate magnets 110 and the inner magnet 114 may be disposed between a top plate 112 and a bottom ring 120 and bottom plate 122 to secure the first elongate magnets 110 and inner magnet 114 in a desired position within the sputter source 101. In some embodiments, for example, where the sputter source 101 is retrofit into a preexisting enclosure (e.g., enclosure 130), a plurality of spacers (two spacers 116, 118 shown) may be utilized to securely fit the first elongate magnets 110 and inner magnet 114 within the enclosure 130. Although shown as a plate in FIG. 1, the target 102 may have any shape suitable to sputter material for a desired application.

Figure 2:
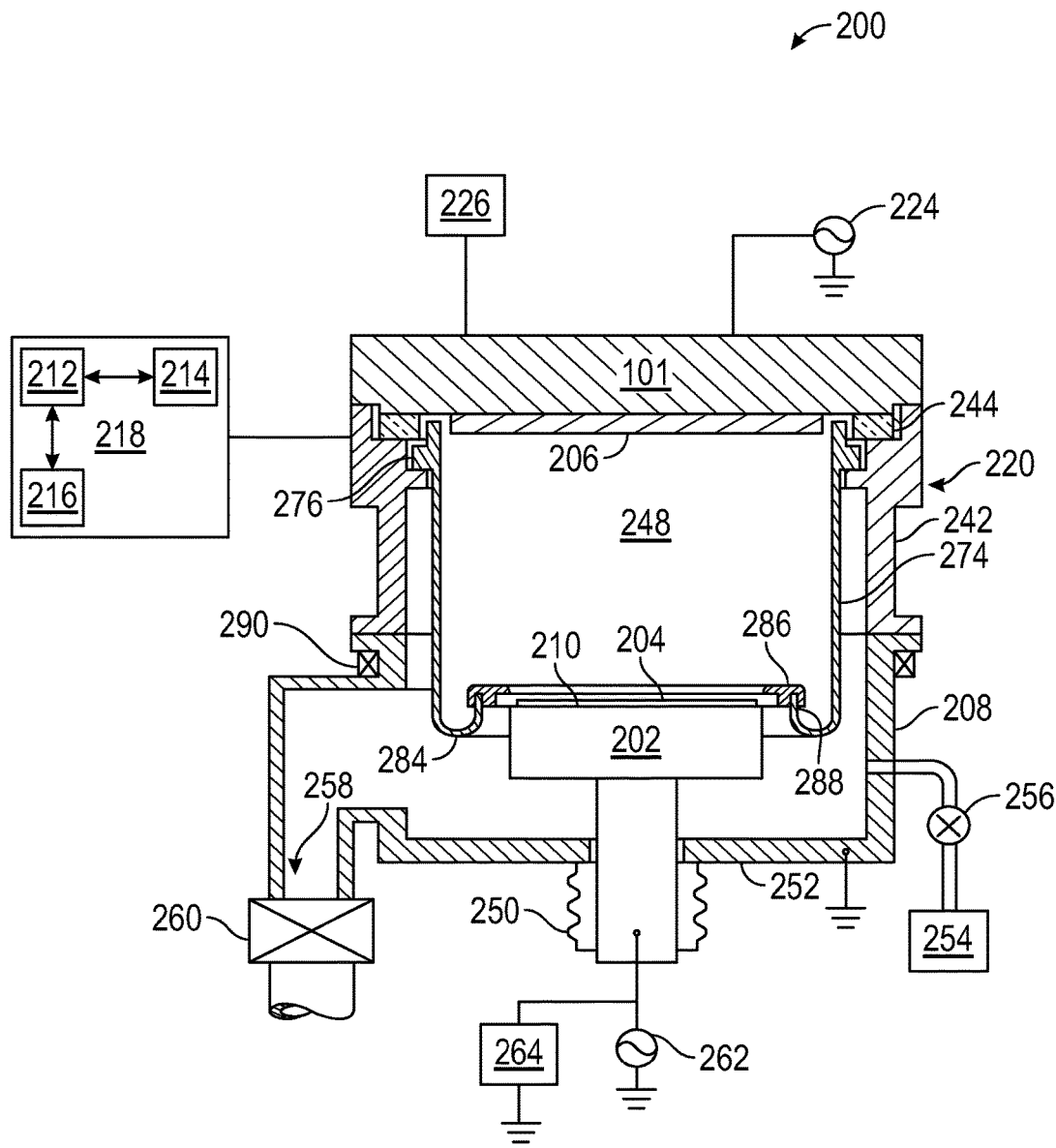
FIG. 2 illustrates a semiconductor process chamber suitable for use with a magnet arrangement in accordance with some embodiments of the present disclosure.

FIG. 2 depicts a process chamber such as a plasma sputter chamber 200 suitable for using the magnetrons in accordance with some embodiments of the present invention. In some embodiments, the plasma sputter chamber 200 may generally include a chamber body 220 having a substrate support pedestal 202 for receiving a substrate 204 thereon, and a sputter source 101 (e.g., sputter source 101 described above) having a target 206 in an upper portion of the plasma sputter chamber 200. The substrate support pedestal 202 may be located within a grounded enclosure wall, which may be the chamber wall 208 (as shown) or a grounded shield. In some embodiments, the sputter source 101 may be supported on a grounded conductive aluminum adapter (adapter) 242 through a dielectric isolator 244.

Any number of power sources may be utilized to provide power to the target 206 to accommodate for a particular application or process performed in the plasma sputter chamber 200. For example, in some embodiments, a DC power source 226 and RF power source 224 may provide DC power and RF power, respectively, to the target 206 via a source distribution plate (not shown), such as the backing plate 108 described above. In such embodiments, the DC power source 226 may be utilized to apply a negative voltage, or bias, to the target 206. In some embodiments, RF energy supplied by the RF power source 224 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

The substrate support pedestal 202 has a substrate support surface 210 facing the principal surface of the target 206 and supports the substrate 204 to be processed. The substrate support pedestal 202 may support the substrate 204 in a processing volume 248 of the plasma sputter chamber 200.

The processing volume 248 is defined as the region above the substrate support pedestal 202 during processing (for example, between the target 206 and the substrate support pedestal 202 when in a processing position).

In some embodiments, the substrate support pedestal 202 may be vertically movable through a bellows 250 connected to a bottom chamber wall 252 to allow the substrate 204 to be transferred onto the substrate support pedestal 202 through a load lock valve (not shown) in the lower portion of processing the plasma sputter chamber 200 and thereafter raised to one or more positions for processing (e.g., as described above).

One or more processing gases may be supplied from a gas source 254 through a mass flow controller 256 into the lower portion of the plasma sputter chamber 200. An exhaust port 258 may be provided and coupled to a pump (not shown) via a valve 260 for exhausting the interior of the plasma sputter chamber 200 and facilitating maintaining a desired pressure inside the plasma sputter chamber 200.

In some embodiments, one or more power sources (an RF power source 262 and DC power source 264 shown) may be coupled to the substrate support pedestal 202. When present, the RF power source 262 may be coupled to the substrate support pedestal 202 to induce a negative DC bias on the substrate 204. In addition, in some embodiments, a negative DC self-bias may form on the substrate 204 during processing.

In some embodiments, the plasma sputter chamber 200 may further include a process kit shield 274 connected to a ledge 276 of the adapter 242. The adapter 242 in turn is sealed and grounded to the chamber wall 208. Generally, the process kit shield 274 extends downwardly along the walls of the adapter 242 and the chamber wall 208 downwardly to below an upper surface of the substrate support pedestal 202 and returns upwardly until reaching an upper surface of the substrate support pedestal 202 (e.g., forming a u-shaped portion 284 at the bottom). Alternatively, the bottommost portion of the process kit shield need not be a u-shaped portion 284 and may have any suitable shape. A cover ring 286 rests on the top of an upwardly extending lip 288 of the process kit shield 274. An additional deposition ring (not shown) may be used to shield the periphery of the substrate 204 from deposition.

In some embodiments, a magnet 290 may be disposed about the plasma sputter chamber 200 for selectively providing a magnetic field between the substrate support pedestal 202 and the target 206. For example, as shown in FIG. 2, the magnet 290 may be disposed about the outside of the chamber wall 208 in a region just above the substrate support pedestal 202. In some embodiments, the magnet 290 may be disposed additionally or alternatively in other locations, such as adjacent the adapter 242. The magnet 290 may be an electromagnet and may be coupled to a power source (not shown) for controlling the magnitude of the magnetic field generated by the electromagnet. When present, the magnet 290 may be configured to provide a uniform magnetic field proximate the substrate 204 to facilitate moving the material sputtered from the target 206 in desired orientation prior to, during, or subsequent to, deposition of the material atop the substrate 204.

A controller 218 may be provided and coupled to various components of the plasma sputter chamber 200 to control the operation thereof. The controller 218 includes a central processing unit (CPU) 212, a memory 214, and support circuits 216. The controller 218 may control the plasma sputter chamber 200 directly, or via computers (or controllers) associated with particular process chamber and/or support system components. The controller 218 may be one of any form of general-purpose computer processor that can be used in an industrial setting for controlling various chambers and sub-processors. The memory, or computer readable medium, 214 of the controller 218 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 216 are coupled to the CPU 212 for supporting the processor in a conventional manner. These circuits include cache, power supplies, clock circuits, input/output circuitry and subsystems, and the like. One or more processes may be stored in the memory 214 as software routine that may be executed or invoked to control the operation of the plasma sputter chamber 200 in the manner described herein. The software routine may also be stored and/or executed by a second CPU (not shown) that is remotely located from the hardware being controlled by the CPU 212.

Figure 3:
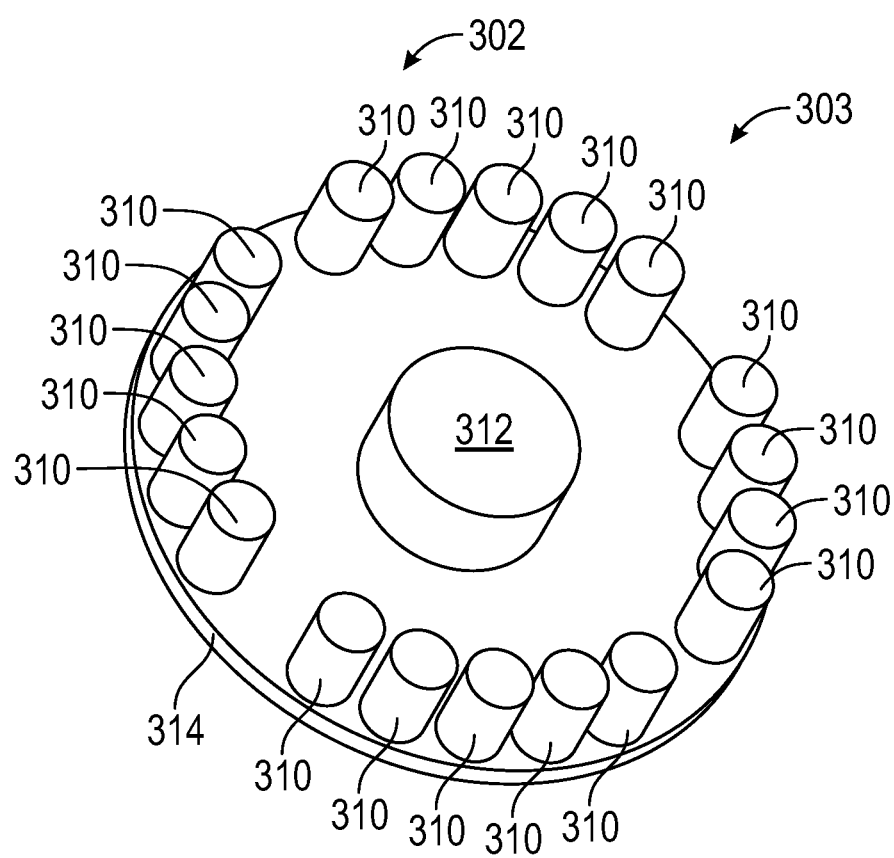
FIG. 3 illustrates a perspective view of a prior art magnet arrangement for use in a process chamber.
Figure 4:
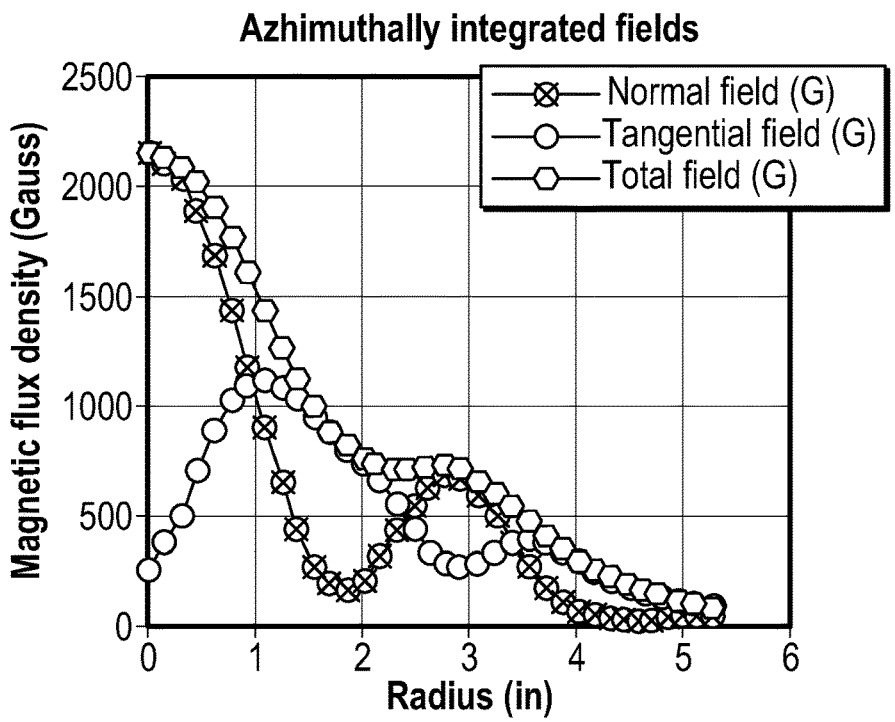
FIG. 4 graphically illustrates magnetic flux density versus radius of a target for the magnet arrangement of FIG. 3.
Figure 5:
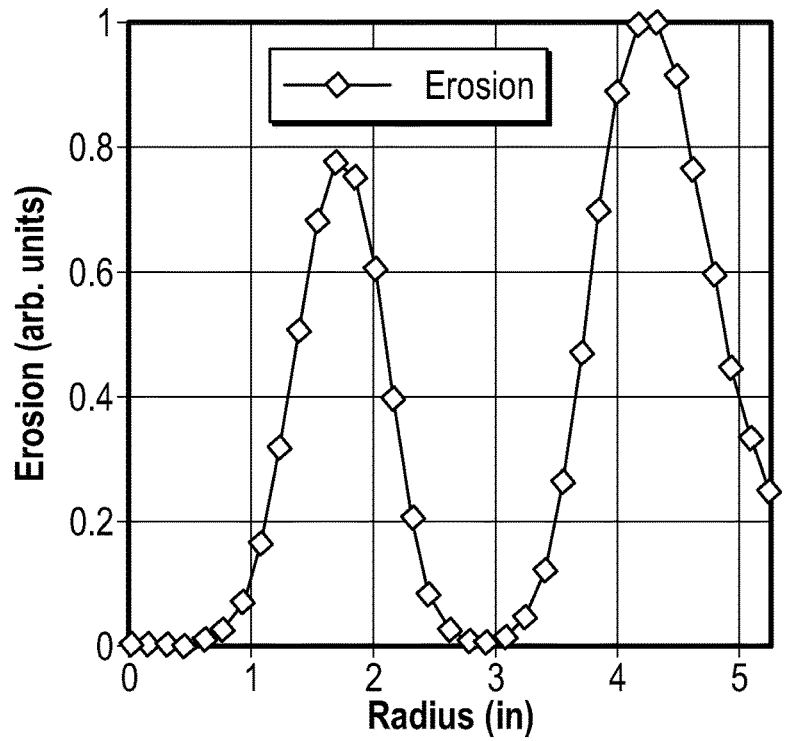
FIG. 5 illustrates target erosion versus radius of a target for the magnet arrangement of FIG. 3.

FIG. 3 depicts a prior art magnetron 303 comprising a support plate 314 and an outer pole 302 including a plurality of first magnets 310 of a first polarity (e.g., North) surrounding an inner magnet 312 of a second polarity (e.g., South). Modelling data shown in FIG. 4 shows a low magnetic flux density across the radius of the target, and FIG. 5 shows an uneven erosion profile across the radius of the target.

Figure 6:
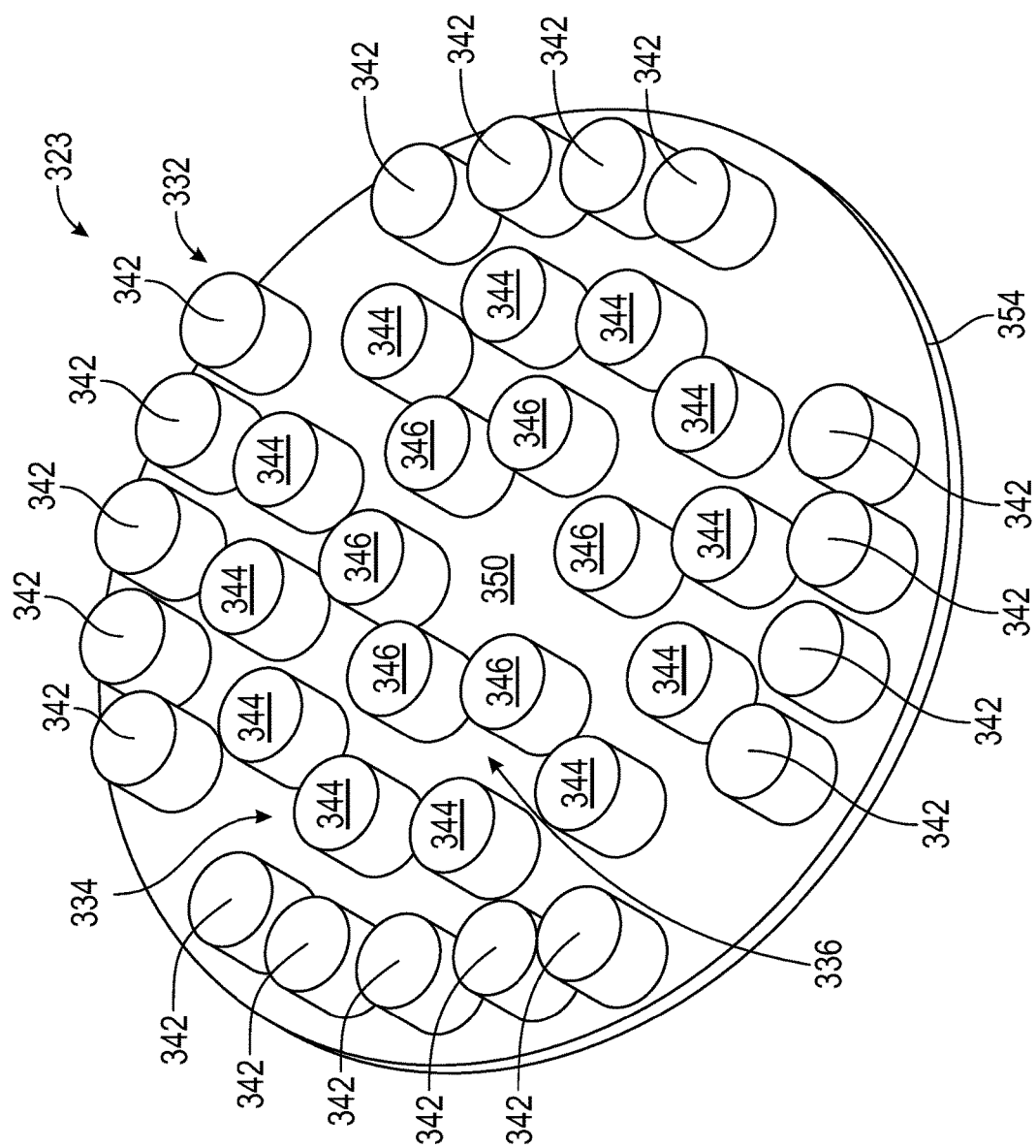
FIG. 6 illustrates a perspective view of a magnet arrangement for use in a process chamber in accordance with some embodiments of the present disclosure.

FIG. 6 depicts a magnetron 323 according to an embodiment of the disclosure. The magnetron 323 comprises an outer pole 332, a first inner pole 334 and a second inner pole 336 on a support plate 354 and positionable at a back of a sputtering target, such as the target 102 shown in FIG. 1 in a fixed relationship with the target 102. As used herein, in a fixed relationship with the target refers to the fact that the magnetron 323 is static and does not move or rotate with respect to the target. In the industry, such a magnetron may be referred to as a static magnetron or stationary magnetron. These are distinguished from magnetrons that are moveable with respect to the target, such as a rotating magnetron having a magnet array that is rotated with respect to the target. The outer pole 332 comprises a plurality of first elongate magnets 342 of a first magnetic polarity (e.g., North polarity), the first elongate magnets 342 mounted on the support plate 354 which may be a magnetic yoke and arranged in a first closed pattern around a central region 350. The closed pattern may be substantially circular as shown. As will be discussed further below, "elongate" magnets refers to the magnets having a length dimension that is greater than their width or diameter dimension. "Substantially circular" refers to the closed pattern being a perfect circle in some embodiments, or in some embodiments, an imperfect circle such as a circle that may not have a constant radius.

Still referring to FIG. 6, the magnetron 323 has a first inner pole 334 disposed within the first closed pattern, separated from the outer pole 332 by a gap, comprising a plurality of second elongate magnets 344 of a second magnetic polarity (e.g., South polarity) opposite the first magnetic polarity arranged in a second closed pattern mounted on the support plate 354 in the form of a magnetic yoke. The closed pattern may be substantially circular as shown.

The magnetron shown in FIG. 6 further includes a second inner pole 336 disposed in the central region 350 and surrounded by the second closed pattern formed by the first inner pole 334, separated from the first inner pole 334 by a gap, comprising at least one of a third elongate magnet 346 of the first magnetic polarity mounted on the support plate 354 in the form of a magnetic yoke, the outer pole, the first inner pole and the second inner pole arranged such that there is an unbalance ratio defined by a total magnetic intensity of poles of magnets of the first polarity to the total magnetic intensity of poles of magnets of the second polarity, and the unbalance ratio is greater than 1 and less than 3. In other words, the total magnetic intensity of the plurality of first elongate magnets 342 and third elongate magnet(s) 346 of the first polarity to the total magnetic intensity of the magnets of the plurality of second elongate magnets 344 of the second polarity is greater than 1 and less than 3.

In some embodiments, the unbalance ratio is in a range of 1 to 2.9, 1 to 2.8, 1 to 2.7, 1 to 2.6, 1 to 2.5, 1 to 2.4, 1 to 2.3, 1 to 2.2, 1.5 to 2.9, 1.5 to 2.8, 1.5 to 2.7, 1.5 to 2.6, 1.5 to 2.5, 1.5 to 2.4, 1.5 to 2.3 or 1.5 to 2.2. In one or more embodiments the magnetron includes three or less poles selected from the outer pole, the first inner pole and the second inner pole. In one or more embodiments, the second inner pole comprises a single magnet. In one or more embodiments, the second inner pole comprises a plurality of magnets arranged in a closed pattern, for example a substantially circular pattern. In one or more embodiments, the magnetron has a diameter in a range of 5.5 inches and 8.5 inches (139.7 mm to 215.9 mm).

Figure 7:
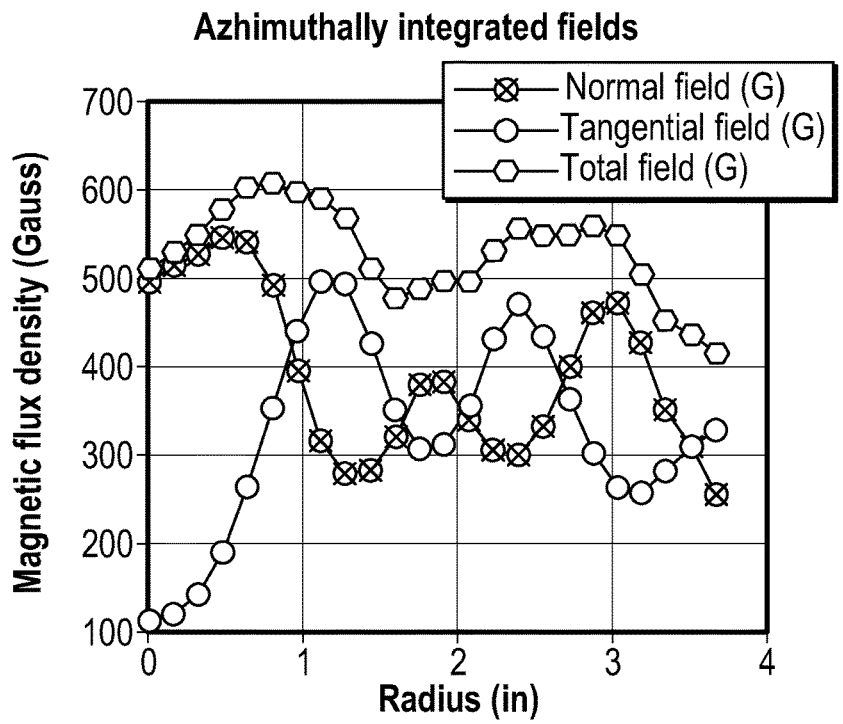
FIG. 7 graphically illustrates magnetic flux density versus radius of a target for the magnet arrangement of FIG. 6.
Figure 8:
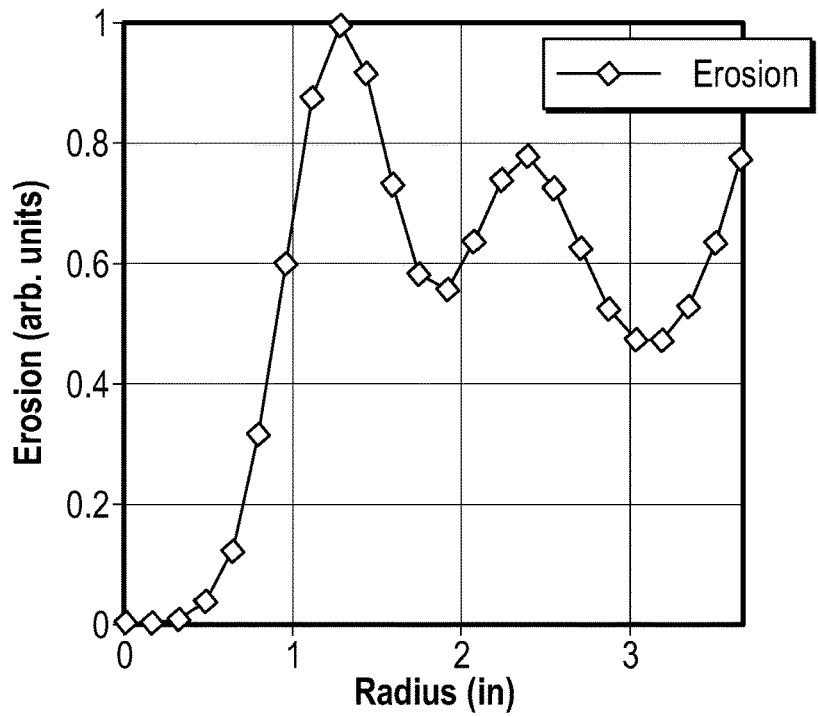
FIG. 8 illustrates target erosion versus radius of a target for the magnet arrangement of FIG. 6.

Modelling data for the magnetron 323 of FIG. 6 is shown in FIG. 7, shows a higher magnetic flux density across the radius of the target than the design of FIG. 3. FIG. 8 shows a more even erosion profile across the radius of the target than the erosion profile shown in FIG. 5.

Figure 9:
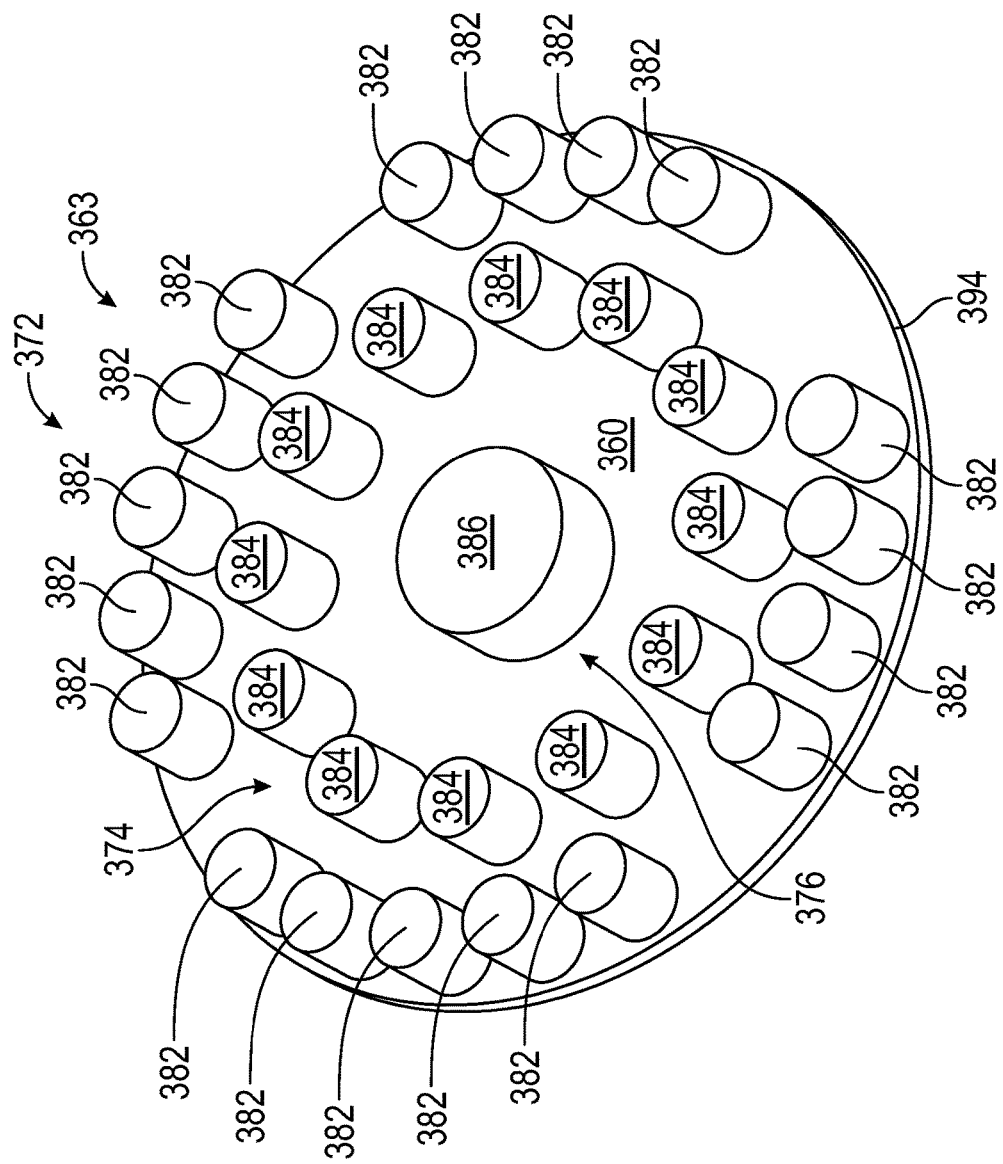
FIG. 9 illustrates a perspective view of a magnet arrangement for use in a process chamber in accordance with some embodiments of the present disclosure.
Figure 10:
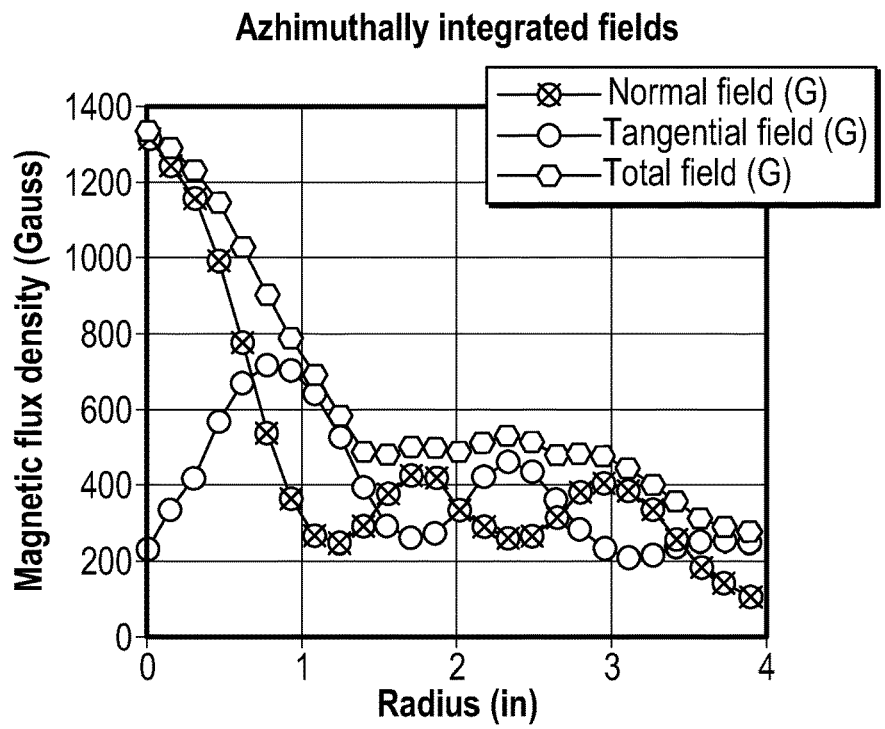
FIG. 10 graphically illustrates magnetic flux density versus radius of a target for the magnet arrangement of FIG. 9.
Figure 11:
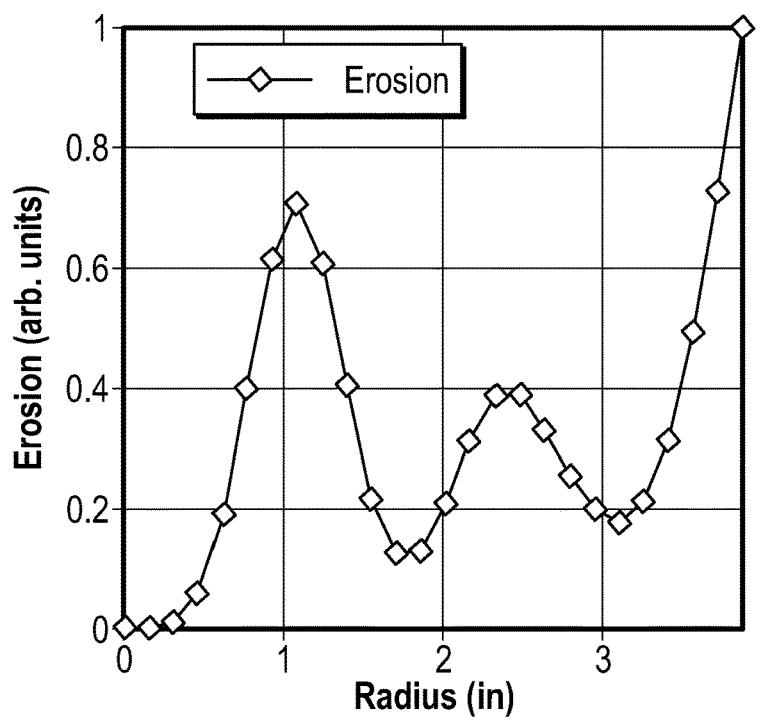
FIG. 11 illustrates target erosion versus radius of a target for the magnet arrangement of FIG. 9.

FIG. 9 depicts an embodiment of a magnetron 363 in which an outer pole 372, a first inner pole 374 and a second inner pole 376 are mounted on a support plate 394 in the form of a magnetic yoke. The outer pole 372 comprises disposed in a first closed pattern a plurality of first elongate magnets 382 of a first magnetic polarity (e.g., North polarity and mounted on the support plate 394. The first inner pole 374 comprises, disposed within the first closed pattern, separated from the outer pole 372 by a gap, a plurality of second elongate magnets 384 of a second magnetic polarity (e.g., South polarity) opposite the first magnetic polarity arranged in a second closed pattern mounted on the support plate 394 in the form of a magnetic yoke. The magnetron 363 in FIG. 9 includes a second inner pole 376 disposed in the central region 360 and surrounded by the second closed pattern formed by the first inner pole 374, separated from the first inner pole 374 by a gap, comprising a third elongate magnet 386 of the first magnetic polarity mounted on the mounted on the support plate 394 in the form of a magnetic yoke, the outer pole, the first inner pole and the second inner pole arranged such that there is an unbalance ratio defined by a total magnetic intensity of poles of magnets of the first polarity to the total magnetic intensity of poles of magnets of the second polarity and the unbalance ratio is greater than 1 and less than 3. Modelling data for the magnetron 363 of FIG. 9 is shown in FIG. 10, which shows a more uniform magnetic flux density across the radius of the target than the design of FIG. 3. FIG. 11 shows a more even erosion profile across the radius of the target than the erosion profile shown in FIG. 5. Further optimization of the unbalance ratio is expected to improve the properties of the target of FIG. 9.

Figure 12A:
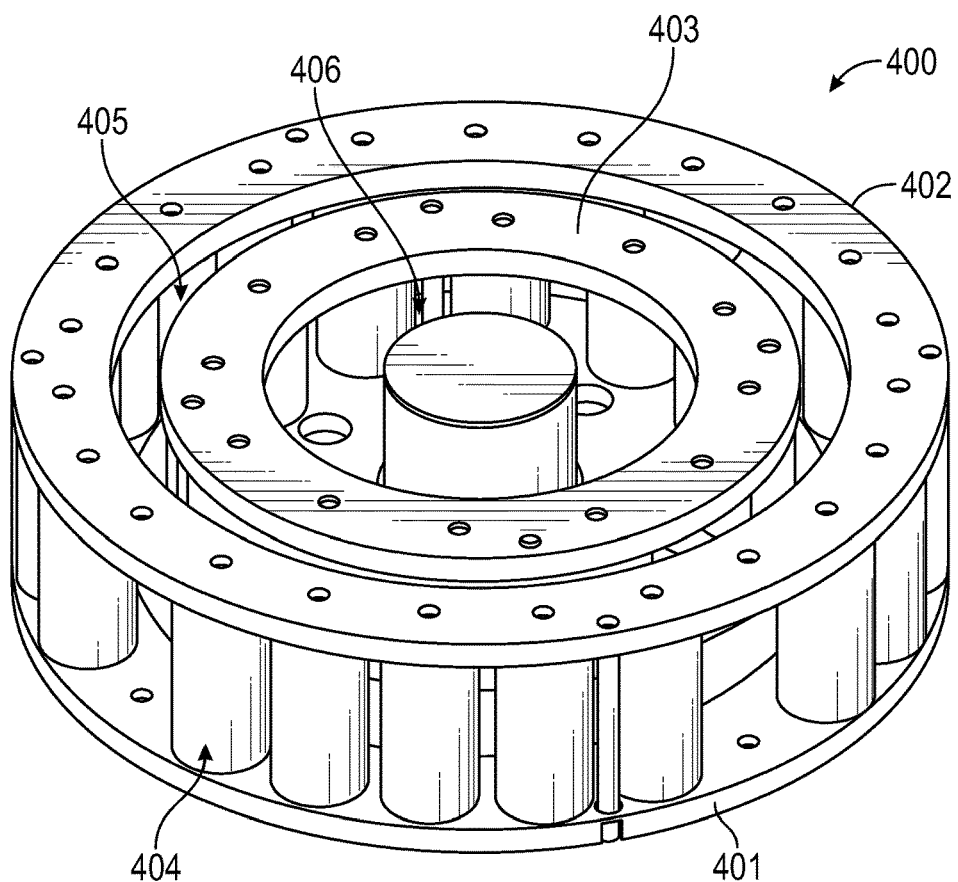
FIG. 12A illustrates a perspective view of a magnetron assembly according to some embodiments of the disclosure.

FIG. 12A shows a fully assembled magnetron 400 comprising a support plate 401 and top plates 402 and 403. The magnetron 400 includes outer pole 404, first inner pole 405 and second inner pole 406.

Figure 12B:
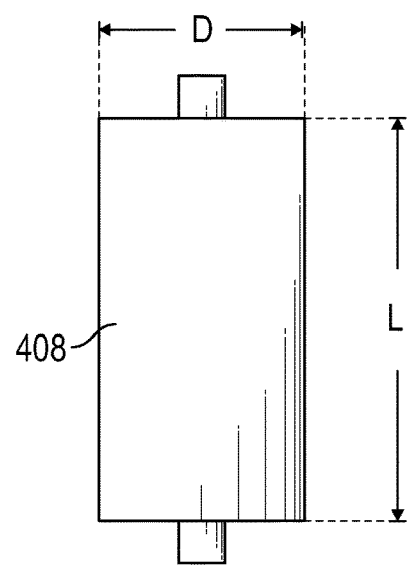
FIG. 12B is a side view of a single magnet from the magnetron assembly shown in FIG. 12A.

In one or more embodiments of the disclosure, the magnets used for at least the outer pole and the first inner pole, and in some embodiments, the second inner pole have dimensions that provide improved performance and more even erosion profiles. Referring to FIG. 12B, the magnet 408 has a length "L" and a width or diameter "D". As used herein, "elongate" refers to a magnet that has a length "L" that is greater than the width or diameter "D" such that the ratio of L:D is greater than 1:1, for example an L:D of greater than 1.1:1, 1.2:1, 1.3:1, 1.4:1, 1.5:1, 1.6:1, 1.7:1, 1.8:1, 1.9:1, 2:1, 2.1:1, 2.2:1, 2.3:1, 2.4:1, 2.5:1, 2.6:1, 2.7:1, 2.8:1, 2.9:1 or 3:1. In one or more embodiments, the ratio of L:D is in a range of 1.5:1 to 5:1, 2:1 to 5:1, or 3:1 to 5:1.

Figure 13:
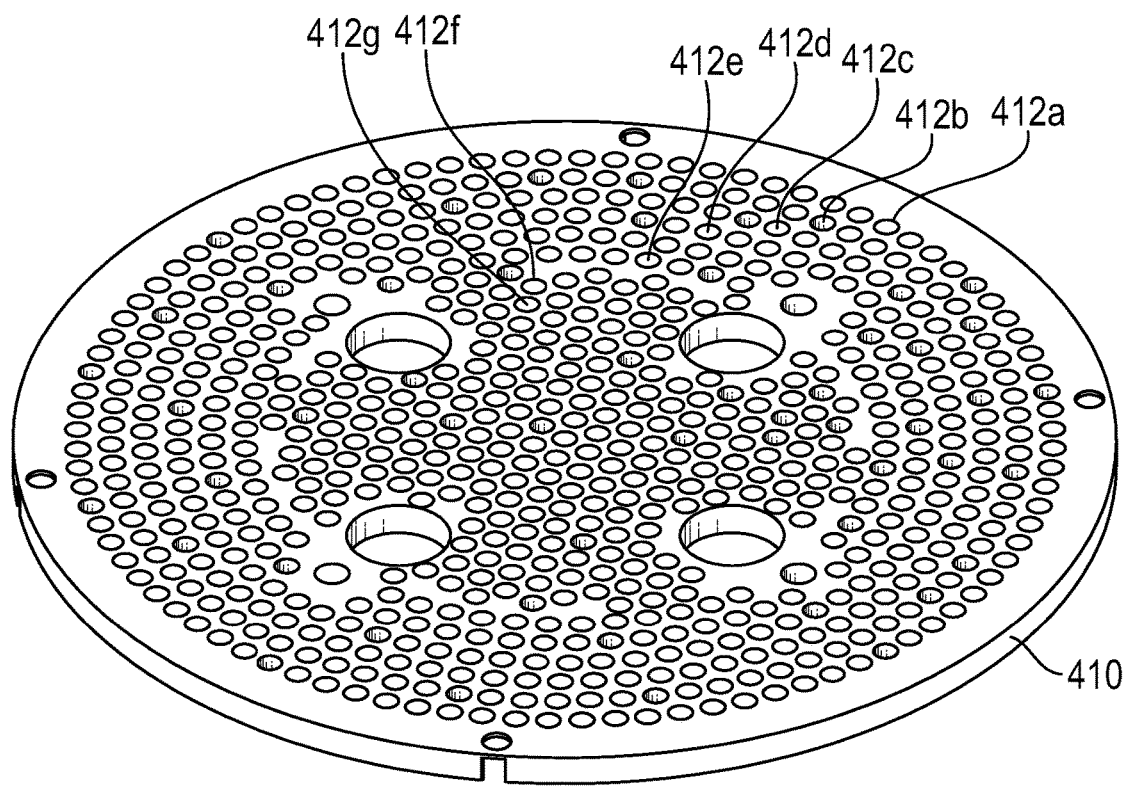
FIG. 13 is a perspective view of a plate for use in assembling magnets in a variety of magnet pattern arrangements.

FIG. 13 depicts a support plate 410 that may be in the form of a magnetic yoke for supporting a plurality of magnets in a variety of patterns described herein. The support plate has multiple openings forming closed patterns 412a, 412b, 412c, 412d, 412e, 412f, 412g, etc. that can allow a variety of concentric substantially circular closed patterns as shown herein.

Figure 14:
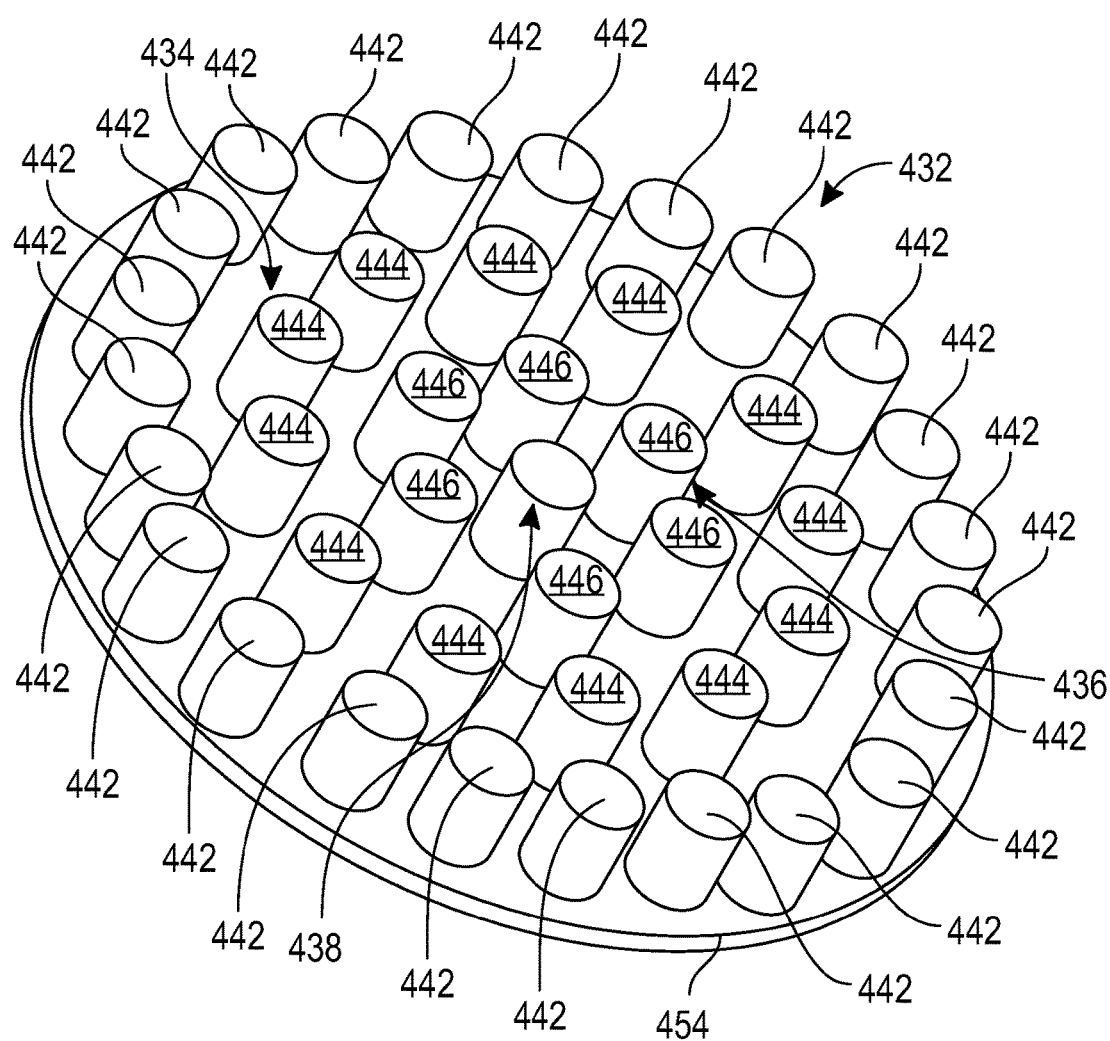
FIG. 14 illustrates a perspective view of a prior art magnet arrangement for use in a process chamber.
Figure 15:
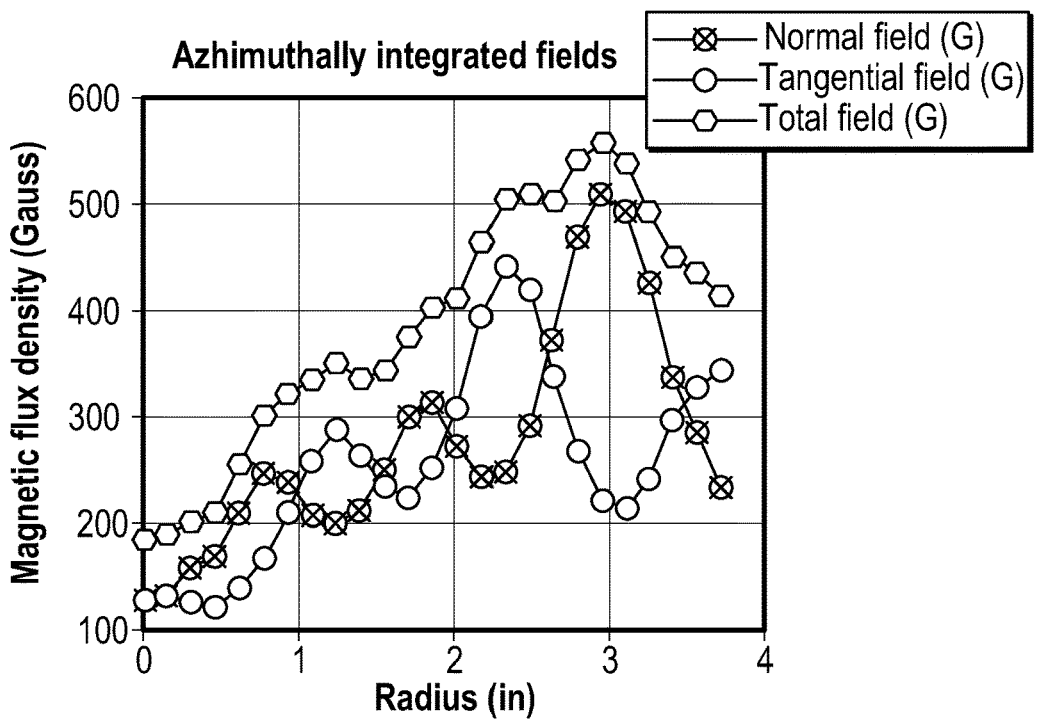
FIG. 15 graphically illustrates magnetic flux density versus radius of a target for the magnet arrangement of FIG. 14.
Figure 16:
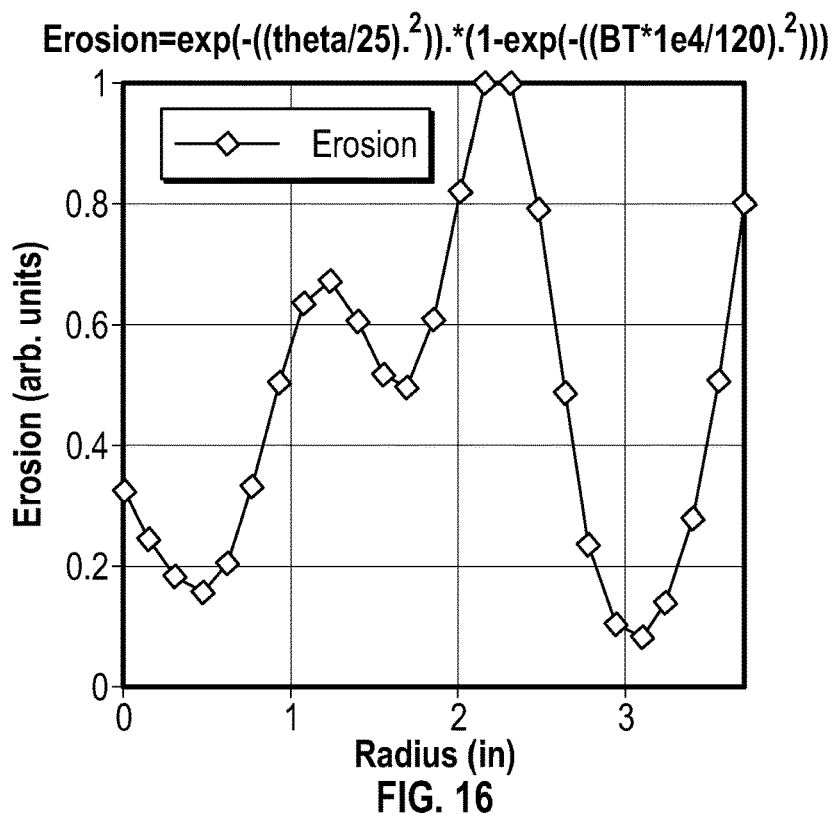
FIG. 16 illustrates target erosion versus radius of a target for the magnet arrangement of FIG. 14.

FIG. 14 shows a comparative example of a magnetron 423 having an outer pole 432 of a first polarity (e.g. North) comprised of a plurality of first elongate magnets 442 arranged in a pattern, a first inner pole 434 of a second polarity (e.g. South) comprised of a plurality of second elongate magnets 444, and a second inner pole 436 of the first polarity comprised of a plurality of third elongate magnets 446 and a third inner pole 438 of the second polarity comprised of a single elongate magnet. Thus, there are more than three poles. FIG. 15 shows the magnetic flux data obtained from modeling and FIG. 16 shows the erosion data for the target. It can be seen that the addition of a fourth pole results in a high degree of variability of the erosion profile resulting in a very uneven profile.

Figure 17:
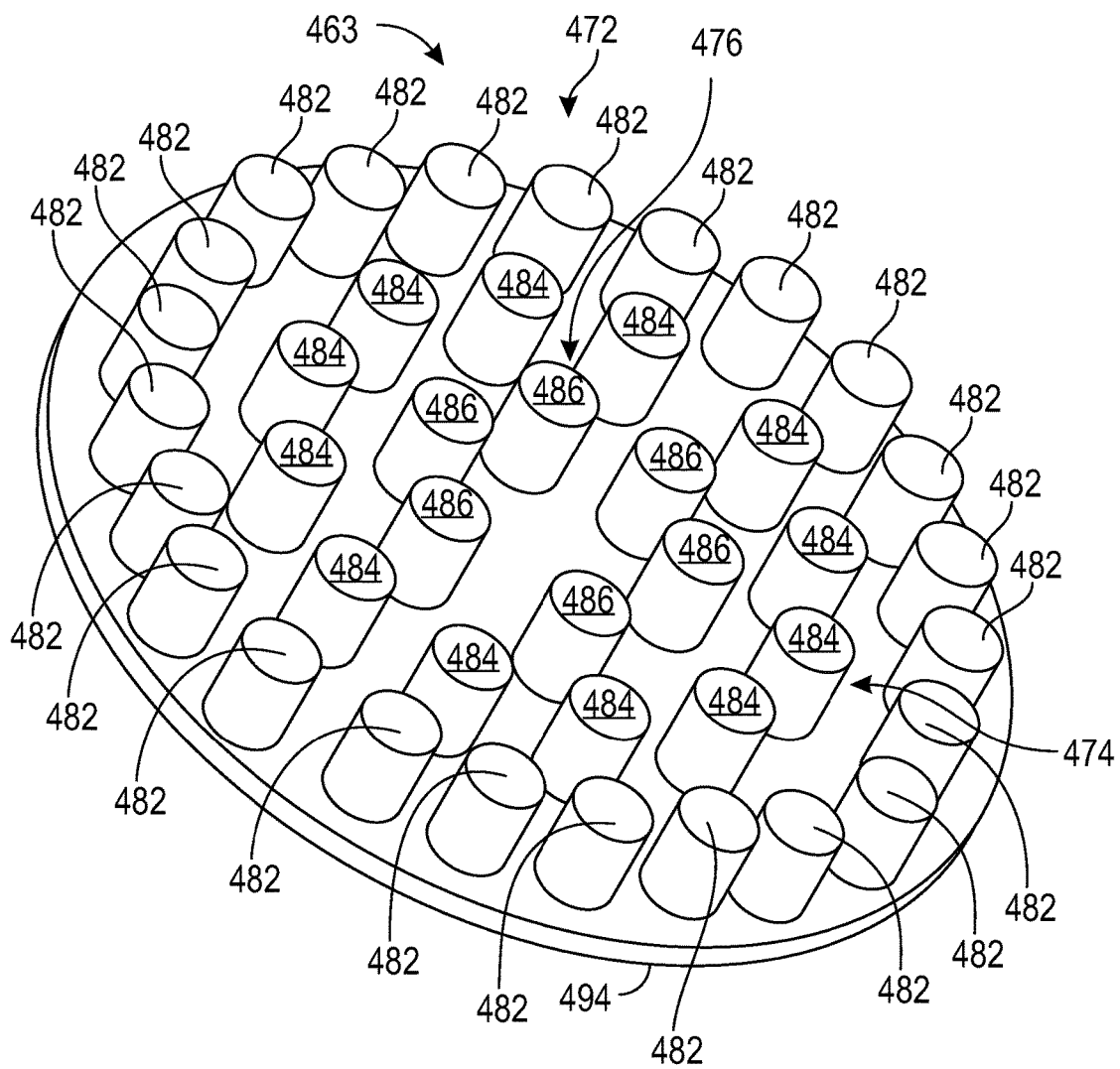
FIG. 17 illustrates a perspective view of a magnet arrangement for use in a process chamber in accordance with some embodiments of the present disclosure.
Figure 18:
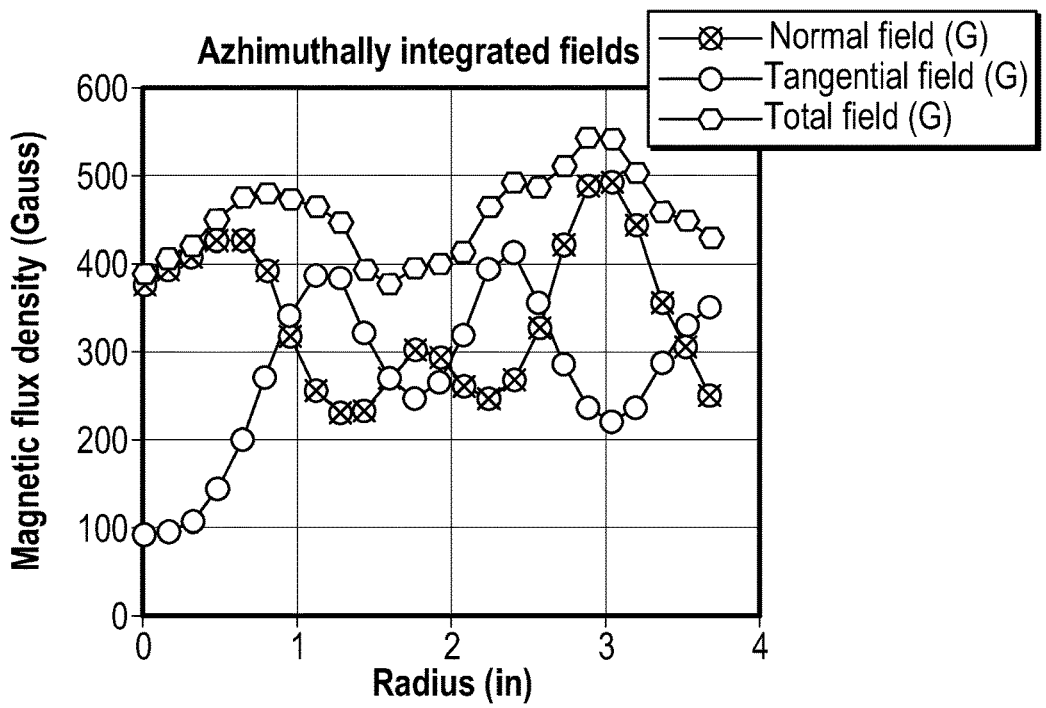
FIG. 18 graphically illustrates magnetic flux density versus radius of a target for the magnet arrangement of FIG. 17.
Figure 19:
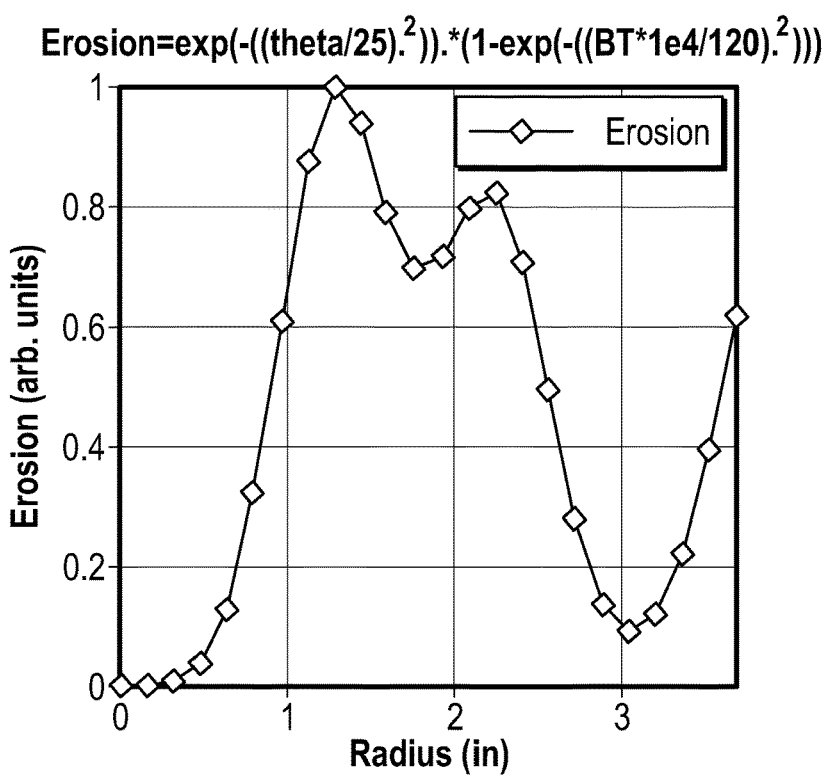
FIG. 19 illustrates target erosion versus radius of a target for the magnet arrangement of FIG. 17.

FIG. 17 shows a magnetron 463 in accordance with an embodiment of the disclosure comprising three poles, namely an outer pole 472 of a first polarity (e.g. North) comprised of a plurality of first elongate magnets 482 arranged in a first closed pattern, a first inner pole 474 of a second polarity (e.g. South) comprised of a plurality of second elongate magnets 484 arranged in a second closed pattern and within the first closed pattern and separated by a gap, and a second inner pole 476 of the first polarity comprised of a plurality of third elongate magnets 486. By limiting the poles to three and an outer closed pattern surrounding a first closed pattern and a second closed pattern, a review of FIG. 18 and FIG. 19 shows an improved magnetic flux density performance and an erosion profile across the radius of the target that is more even than that shown in FIG. 15 and FIG. 16. It is expected that optimization of the unbalance ratio within the ranges discussed above could provide further performance improvements.

In one or more embodiments, the magnetron is 5.5 to 8.5 inches (139.7 mm to 215.9 mm) in diameter and positionable at a back of a sputtering target having a diameter in a range of 5.5 to 8.5 inches (139.7 mm to 215.9 mm) in a fixed relationship with the target. In one or more embodiments the outer pole comprises 15-30, 15-25, 15-23, or 15-19 individual discrete elongate cylindrical magnets having L:D ratios discussed herein, a first inner pole comprising 8-12, 9-12, or 10-12 individual discrete elongate cylindrical magnets having L:D ratios discussed herein, and a second inner pole comprising 1-6, 2-6, 3-6, 4-6 or 5-6 individual discrete elongate cylindrical magnets having L:D ratios discussed herein. This number of magnets in each respective outer pole, first inner pole and second inner pole having a selected L:D ratio permits optimization of the unbalance ratio to be greater than or equal to 1 and less than 3.

Figure 20:
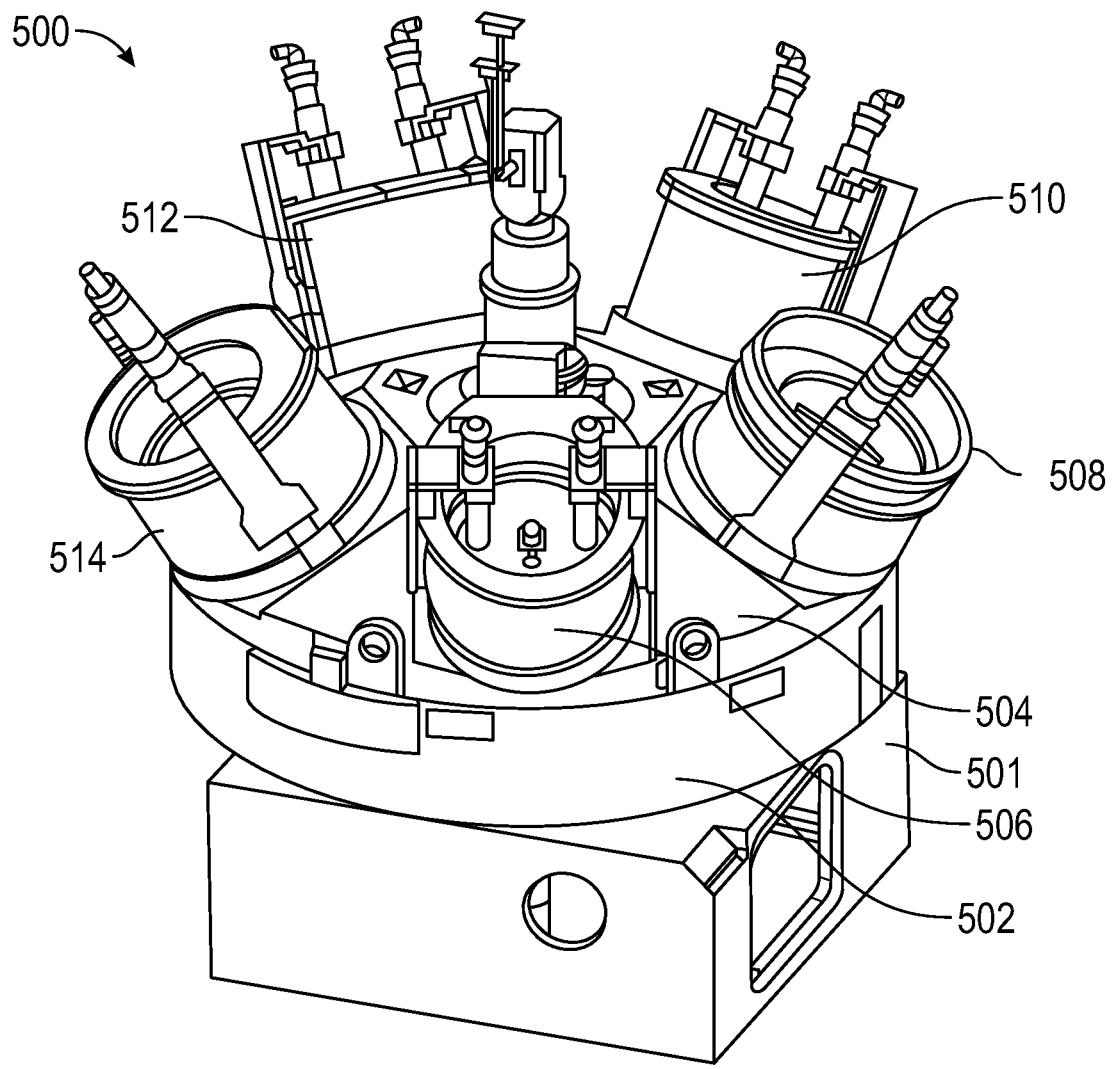
FIG. 20 illustrates a multi-cathode PVD deposition chamber according to an embodiment.

Referring now to FIG. 20, an upper portion of a multi-cathode PVD chamber such as a plasma sputter chamber 500 is shown in accordance with an embodiment. The multi-cathode plasma sputter chamber 500 includes a base structure 501 with a cylindrical body portion 502 capped by a top adapter 504. The top adapter 504 has provisions for a number of cathode sources, such as cathode sources 506, 508, 510, 512, and 514, positioned around the top adapter 504. The magnetrons described in FIG. 6, FIG. 9 and FIG. 17 and variants thereof can be utilized in the multi-cathode source chamber 500 to form the multilayer stack, as well as capping layers, absorber layers and antireflective layers as described above in the single chamber. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds can include oxides, dioxides, atomic mixtures having oxygen atoms, or a combination thereof.

Another aspect of the disclosure pertains to a method of processing a substrate in a plasma sputter chamber, the method comprising placing a substrate on a substrate support within a processing volume of the plasma sputter chamber defined by a chamber wall, the processing volume including an upper portion and a lower portion, the substrate support in the lower portion; the upper portion including a magnetron comprising an outer pole, a first inner pole and a second inner pole positionable at a back of a sputtering target in a fixed relationship with the target; the outer pole comprising a plurality of first elongate magnets of a first magnetic polarity, the first elongate magnets mounted on a magnetic yoke arranged in a first closed pattern around a central region; the first inner pole disposed within the first closed pattern, separated from the outer pole by a gap, comprising a plurality of second elongate magnets of a second magnetic polarity opposite the first magnetic polarity arranged in a second closed pattern mounted on the magnetic yoke; and the second inner pole disposed in the central region and surrounded by the second closed pattern, separated from the first inner pole by a gap, comprising at least one of a third elongate magnet of the first magnetic polarity mounted on the magnetic yoke, the poles arranged such that there is an unbalance ratio defined by a total magnetic intensity of poles of magnets of the first polarity to the total magnetic intensity of poles of magnets of the second polarity and the unbalance ratio is greater than 1 and less than 3; and sputtering material from the target comprising source material located above the substrate support in the upper portion onto a substrate.

In an embodiment of the method, the magnetron includes three or less poles selected from the outer pole, the first inner pole and the second inner pole and the target has a diameter in a range of 5.5 inches and 8.5 inches. In one or more embodiments of the method, the substrate is a low thermal expansion substrate for use as an EUV mask blank and the source material is selected from molybdenum, silicon, and tantalum-containing material, and the method comprises depositing a multilayer stack of alternating layers of molybdenum and silicon and depositing an EUV absorbing layer comprising tantalum. In one or more embodiments of the method, the plasma sputter chamber contains a first sputtering target comprising silicon, a second target comprising molybdenum, and a third target comprising tantalum, the method comprising depositing the multilayer stack by alternately sputtering the first target and the second target and then sputtering the third target to form a layer comprising tantalum on the multilayer stack.

Thus, chamber and methods are provided which provide a more even erosion profile of the target. In addition, the magnetrons described here can operate at a higher flux density than existing magnetrons, which provides a lower ignition pressure for the plasma. A lower ignition pressure allows the formation of films with improved properties and less defects, which is particularly advantageous for Mo/Si multilayer films used in the manufacture of EUV mask blanks. Lower pressure allows for the formation of higher density layers and improved properties of the EUV mask blanks.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A magnetron for a plasma sputter chamber comprising:
a magnetron comprising an outer pole, a first inner pole and a second inner pole positionable at a back of a sputtering target in a fixed relationship with the target;
the outer pole comprising a plurality of first elongate magnets of a first magnetic polarity, the first elongate magnets mounted on a magnetic yoke arranged in a first closed pattern around a central region;
the first inner pole disposed within the first closed pattern, separated from the outer pole by a gap, comprising a plurality of second elongate magnets of a second magnetic polarity opposite the first magnetic polarity arranged in a second closed pattern mounted on the magnetic yoke; and
the second inner pole disposed in the central region and surrounded by the second closed pattern, separated from the first inner pole by a gap, comprising at least one of a third elongate magnet of the first magnetic polarity mounted on the magnetic yoke, the poles arranged such that there is an unbalance ratio defined by a total magnetic intensity of poles of magnets of the first polarity to the total magnetic intensity of poles of magnets of the second polarity and the unbalance ratio is greater than 1 and less than 3.

2. The magnetron of claim 1, wherein the first closed pattern and the second closed pattern are substantially circular.

3. The magnetron of claim 1, wherein the unbalance ratio is in a range of 1.5 to 2.5.

4. The magnetron of claim 2, wherein the magnetron includes three or less poles selected from the outer pole, the first inner pole and the second inner pole.

5. The magnetron of claim 2, wherein the second inner pole comprises a single magnet.

6. The magnetron of claim 2, wherein the second inner pole comprises a plurality of magnets arranged in a circular pattern.

7. The magnetron of claim 2, wherein the magnetron has a diameter in a range of 5.5 inches and 8.5 inches.

8. The magnetron of claim 2, wherein the elongate magnets are substantially cylindrical having a length and a diameter, and there is a ratio of length to diameter greater than 2:1.

9. A plasma sputter chamber comprising:
a chamber wall defining a processing volume within the plasma sputter chamber;
a magnetron comprising an outer pole, a first inner pole and a second inner pole positionable at a back of a sputtering target in a fixed relationship with the target;
the outer pole comprising a plurality of first elongate magnets of a first magnetic polarity, the first elongate magnets mounted on a magnetic yoke arranged in a first closed pattern around a central region;
the first inner pole disposed within the first closed pattern, separated from the outer pole by a gap, comprising a plurality of second elongate magnets of a second magnetic polarity opposite the first magnetic polarity arranged in a second closed pattern mounted on the magnetic yoke; and
the second inner pole disposed in the central region and surrounded by the second closed pattern, separated from the first inner pole by a gap, comprising at least one of a third elongate magnet of the first magnetic polarity mounted on the magnetic yoke, the outer pole, the first inner pole and the second inner pole arranged such that there is an unbalance ratio defined by a total magnetic intensity of poles of magnets of the first polarity to the total magnetic intensity of poles of magnets of the second polarity and the unbalance ratio is greater than 1 and less than 3.

10. The plasma sputter chamber of claim 9, wherein the first closed pattern and the second closed pattern are substantially circular.

11. The plasma sputter chamber of claim 9, wherein the unbalance ratio is in a range of 1.5 to 2.5.

12. The plasma sputter chamber of claim 10, wherein the magnetron includes three or less poles selected from the outer pole, the first inner pole and the second inner pole.

13. The plasma sputter chamber of claim 10, wherein the second inner pole comprises a single magnet.

14. The plasma sputter chamber of claim 10, wherein the second inner pole comprises a plurality of magnets arranged in a circular pattern.

15. The plasma sputter chamber of claim 10, wherein the magnetron has a diameter in a range of 5.5 inches and 8.5 inches.

16. The plasma sputter chamber of claim 10, wherein the elongate magnets are substantially cylindrical having a length and a diameter, and there is a ratio of length to diameter greater than 2:1.

17. A method of processing a substrate in a plasma sputter chamber chamber, the method comprising:
placing a substrate on a substrate support within a processing volume of the plasma sputter chamber defined by a chamber wall, the processing volume including an upper portion and a lower portion, the substrate support in the lower portion;
the upper portion including a magnetron comprising an outer pole, a first inner pole and a second inner pole positionable at a back of a sputtering target in a fixed relationship with the target;
the outer pole comprising a plurality of first elongate magnets of a first magnetic polarity, the first elongate magnets mounted on a magnetic yoke arranged in a first closed pattern around a central region;
the first inner pole disposed within the first closed pattern, separated from the outer pole by a gap, comprising a plurality of second elongate magnets of a second magnetic polarity opposite the first magnetic polarity arranged in a second closed pattern mounted on the magnetic yoke; and
the second inner pole disposed in the central region and surrounded by the second closed pattern, separated from the first inner pole by a gap, comprising at least one of a third elongate magnet of the first magnetic polarity mounted on the magnetic yoke, the poles arranged such that there is an unbalance ratio defined by a total magnetic intensity of poles of magnets of the first polarity to the total magnetic intensity of poles of magnets of the second polarity and the unbalance ratio is greater than 1 and less than 3; and
sputtering material from the target comprising source material located above the substrate support in the upper portion onto a substrate.

18. The method of claim 17, wherein the magnetron includes three or less poles selected from the outer pole, the first inner pole and the second inner pole and the target has a diameter in a range of 5.5 inches and 8.5 inches.

19. The method of claim 18, wherein the substrate is a low thermal expansion substrate for use as an EUV mask blank and the source material is selected from molybdenum, silicon, and tantalum-containing material, and the method comprises depositing a multilayer stack of alternating layers of molybdenum and silicon and depositing an EUV absorbing layer comprising tantalum.

20. The method of claim 19, wherein the plasma sputter chamber contains a first sputtering target comprising silicon, a second target comprising molybdenum, and a third target comprising tantalum, the method comprising depositing the multilayer stack by alternately sputtering the first target and the second target and then sputtering the third target to form a layer comprising tantalum on the multilayer stack.

* * * * *

UNITED STATES PATENT AND TRADEMARK OFFICE
CERTIFICATE OF CORRECTION

PATENT NO. : 10,504,705 B2
APPLICATION NO. : 15/706129
DATED : December 10, 2019
INVENTOR(S) : Behara et al.

Page 1 of 1

It is certified that error appears in the above-identified patent and that said Letters Patent is hereby corrected as shown below:

In the Specification

- In Column 9, Line 49, delete "mounted on the".

In the Claims

- In Column 14, Line 6, Claim 17, delete "chamber".

Signed and Sealed this
Fourth Day of February, 2020

Andrei Iancu
*Director of the United States Patent and Trademark Office*